United States Patent
Lee et al.

(10) Patent No.: US 9,196,828 B2
(45) Date of Patent: Nov. 24, 2015

(54) RESISTIVE MEMORY AND FABRICATING METHOD THEREOF

(71) Applicant: MACRONIX International Co., Ltd., Hsinchu (TW)

(72) Inventors: Ming-Hsiu Lee, Hsinchu (TW); Wei-Chih Chien, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 299 days.

(21) Appl. No.: 13/849,422

(22) Filed: Mar. 22, 2013

(65) Prior Publication Data

US 2013/0341583 A1 Dec. 26, 2013

Related U.S. Application Data

(63) Continuation-in-part of application No. 13/601,209, filed on Aug. 31, 2012.

(60) Provisional application No. 61/663,651, filed on Jun. 25, 2012, provisional application No. 61/751,263, filed on Jan. 11, 2013.

(51) Int. Cl.
*H01L 45/00* (2006.01)
*H01L 27/24* (2006.01)

(52) U.S. Cl.
CPC ............ *H01L 45/1253* (2013.01); *H01L 45/04* (2013.01); *H01L 45/06* (2013.01); *H01L 45/126* (2013.01); *H01L 45/1233* (2013.01);
(Continued)

(58) Field of Classification Search
CPC .............. H01L 45/1206; H01L 45/122; H01L 45/1253; H01L 45/126; G11C 13/0007
See application file for complete search history.

(56) References Cited

U.S. PATENT DOCUMENTS 7,023,014 B2 * 4/2006 Morimoto et al. .............. 257/42
7,522,446 B2 4/2009 Lee et al.
(Continued)

FOREIGN PATENT DOCUMENTS

CN 101241966 8/2008
TW 200620535 6/2006

OTHER PUBLICATIONS

"Office Action of Chinese Counterpart Application", issued on Feb. 4, 2015, p. 1-p. 5.
(Continued)

*Primary Examiner* — Allison P Bernstein
(74) *Attorney, Agent, or Firm* — J.C. Patents

(57) ABSTRACT

A resistive memory and a fabricating method thereof are provided. The resistive memory includes first and second electrodes, a variable resistance material layer, a first dielectric layer, and a second dielectric layer. The first electrode includes a first portion and a second portion. The second electrode is disposed opposite to the first electrode. The variable resistance material layer includes a sidewall and first and second surfaces opposite to each other, wherein the first surface is connected with the first portion of the first electrode and the second surface is electrically connected with the second electrode. The second portion surrounds the sidewall of the variable resistance material layer and is connected with the first portion. The first dielectric layer is disposed between the first and the second electrodes. The second dielectric layer is disposed between the variable resistance material layer and the second portion of the first electrode.

14 Claims, 9 Drawing Sheets

(52) U.S. Cl.
CPC ............ *H01L45/144* (2013.01); *H01L 45/146* (2013.01); *H01L 45/16* (2013.01); *H01L 45/1683* (2013.01); *H01L 27/2463* (2013.01)

(56) References Cited

U.S. PATENT DOCUMENTS

| | | | |
|---|---|---|---|
| 7,527,985 B2 | 5/2009 | Lai et al. | |
| 7,829,930 B2 * | 11/2010 | Terao et al. | 257/314 |
| 7,867,815 B2 | 1/2011 | Lung et al. | |
| 7,923,712 B2 * | 4/2011 | Arnold et al. | 257/2 |
| 8,208,294 B2 | 6/2012 | Happ et al. | |
| 8,598,011 B2 * | 12/2013 | Song et al. | 438/385 |
| 8,796,101 B2 * | 8/2014 | Czubatyj et al. | 438/382 |
| 8,995,170 B2 * | 3/2015 | Kawashima et al. | 365/148 |
| 2002/0106849 A1 | 8/2002 | Moore | |
| 2015/0109093 A1 * | 4/2015 | Higano et al. | 338/20 |

OTHER PUBLICATIONS

"Notice of Allowance of US Parent Application", issued on Apr. 23, 2015, p. 1-p. 9.

* cited by examiner

RESISTIVE MEMORY AND FABRICATING METHOD THEREOF

CROSS-REFERENCE TO RELATED APPLICATION

This application is a continuation-in-part application of and claims the priority benefit of U.S. application Ser. No. 13/601,209, filed on Aug. 31, 2012, now pending, which claims the priority benefit of U.S. provisional application Ser. No. 61/663,651, filed on Jun. 25, 2012. This application also claims the priority benefit of U.S. provisional application Ser. No. 61/751,263, filed on Jan. 11, 2013. The entirety of each of the above-mentioned patent applications is hereby incorporated by reference herein and made a part of this specification.

BACKGROUND OF THE INVENTION

1. Field of the Invention

The invention relates to a semiconductor device and a fabricating method thereof and more particularly relates to a resistive memory and a fabricating method thereof.

2. Description of Related Art

A resistive memory has the advantages of low operation voltage, fast operation speed, simplified structure, and good durability, etc. and thus has become the most potential memory type in recent years. Generally speaking, the operation modes for switching the storage state of the resistive memory include a unipolar switching and a bipolar switching. Specifically, the operation mode of the unipolar switching is to use voltage pulses of the same polarity (e.g. positive voltage pulse or negative voltage pulse) to perform a programming operation and an erasing operation of the memory cell. The operation mode of the bipolar switching is to use voltage pulses of different polarities to respectively perform the programming operation and the erasing operation of the memory cell.

In addition, for the conventional resistive memory, heat energy is generated due to the resistance characteristics of an electrode when an operation current passes through the electrode, and the heat energy changes the resistance state of the variable resistance material layer in the memory cell, thereby switching the memory state of the memory cell. However, the operation current heats the entire electrode, and the variable resistance material layer only contacts a part of the electrode. Thus, when sufficient heat energy is generated to change the resistance state of the variable resistance material layer, the heat energy generated at areas of the electrode that are not in contact with the variable resistance material layer is not used and wasted. Nevertheless, if the operation current is lowered to reduce waste of the energy, the operation efficiency of the device may decrease.

SUMMARY OF THE INVENTION

The invention provides a resistive memory, which includes an electrode having less thickness above a variable resistance material layer.

The invention provides a fabricating method for fabricating the resistive memory of the invention.

The invention provides a resistive memory, which includes a first electrode, a second electrode, a variable resistance material layer, a first dielectric layer, and a second dielectric layer. The first electrode includes a first portion and a second portion. The second electrode is disposed opposite to the first electrode. The variable resistance material layer has a sidewall and first and second surfaces opposite to each other, wherein the first surface of the variable resistance material layer is connected with the first portion of the first electrode and the second surface of the variable resistance material layer is electrically connected with the second electrode. The sidewall of the variable resistance material layer is surrounded by the second portion, which is connected with the first portion. The first dielectric layer is disposed between the first and the second electrodes. The second dielectric layer is disposed between the variable resistance material layer and the second portion of the first electrode.

In an embodiment of the invention, the first portion and the second portion are formed of different materials, wherein the resistance of the material of the first portion is higher than the resistance of the material of the second portion. The material of the first portion includes titanium nitride, tantalum nitride, or polysilicon; and the material of the second portion includes tungsten, copper, aluminum, an aluminum-copper alloy, or an aluminum-silicon-copper alloy.

In an embodiment of the invention, the first portion and the second portion are formed of the same material, wherein the material of the first electrode includes titanium nitride, tantalum nitride, tungsten, copper, aluminum, an aluminum-copper alloy, or an aluminum-silicon-copper alloy.

In an embodiment of the invention, the resistive memory further includes a conductive layer, wherein the conductive layer is connected with the variable resistance material layer and the second electrode.

In an embodiment of the invention, a material of the variable resistance material layer includes a chalcogenide or a transition metal oxide.

In an embodiment of the invention, the second electrode includes a third portion and a fourth portion, wherein the second surface of the variable resistance material layer is connected with the third portion of the second electrode, and the fourth portion surrounds the sidewall of the variable resistance material layer and is connected with the third portion.

In an embodiment of the invention, the second dielectric layer is disposed between the variable resistance material layer and the second portion of the first electrode and disposed between the variable resistance material layer and the fourth portion of the second electrode.

In an embodiment of the invention, the third portion and the fourth portion of the second electrode are formed of different materials, wherein the resistance of the material of the third portion is higher than the resistance of the material of the fourth portion. The material of the third portion includes titanium nitride, tantalum nitride, or polysilicon; and the material of the fourth portion includes tungsten, copper, aluminum, an aluminum-copper alloy, or an aluminum-silicon-copper alloy.

In an embodiment of the invention, the third portion and the fourth portion of the second electrode are formed of the same material, wherein the material of the second electrode includes titanium nitride, tantalum nitride, tungsten, copper, aluminum, an aluminum-copper alloy, or an aluminum-silicon-copper alloy.

The invention provides another resistive memory, which includes a first electrode, a second electrode, a memory device, and a dielectric layer. The first electrode has a first thickness and a second thickness, wherein the first thickness is greater than the second thickness. The second electrode is disposed opposite to the first electrode. The memory device has a first surface and a second surface, and the memory device is located between the first electrode having the second thickness and the second electrode. The dielectric layer surrounds the memory device, wherein the dielectric layer is coplanar with the first surface of the memory device, and the dielectric layer and the first surface of the memory device are in contact with the first electrode having the second thickness.

In another embodiment of the invention, the material of the first electrode includes titanium nitride, tantalum nitride, tungsten, copper, aluminum, an aluminum-copper alloy, or an aluminum-silicon-copper alloy.

In another embodiment of the invention, the resistive memory further includes a conductive layer, wherein the conductive layer is connected with the memory device and the second electrode.

In another embodiment of the invention, the material of the memory device includes a chalcogenide or a transition metal oxide.

In another embodiment of the invention, the second electrode has a third thickness and a fourth thickness; the memory device is located between the first electrode having the second thickness and the second electrode having the fourth thickness; the dielectric layer is coplanar with the second surface of the memory device; and the dielectric layer and the second surface of the memory device are in contact with the second electrode having the fourth thickness.

In another embodiment of the invention, the material of the second electrode includes titanium nitride, tantalum nitride, tungsten, copper, aluminum, an aluminum-copper alloy, or an aluminum-silicon-copper alloy.

The invention further provides a method for fabricating a resistive memory, which includes the following steps. A first electrode is formed, wherein the first electrode includes a first portion and a second portion. A second electrode is formed opposite to the first electrode. A first dielectric layer is formed between the first electrode and the second electrode. A second dielectric layer and a variable resistance material layer are formed in the first dielectric layer, wherein the variable resistance material layer includes a sidewall and first and second surfaces opposite to each other. The second dielectric layer surrounds the sidewall of the variable resistance material layer. The first portion of the first electrode is connected with the first surface of the variable resistance material layer. The second electrode is electrically connected with the second surface of the variable resistance material layer. The second portion surrounds the sidewall of the variable resistance material layer and is connected with the first portion. Moreover, the second dielectric layer is located between the second portion of the first electrode and the variable resistance material layer.

In yet another embodiment of the invention, the fabricating method of the resistive memory includes the following steps. The second electrode is formed. The first dielectric layer is formed on the second electrode. An opening is formed in the first dielectric layer to expose a portion of the second electrode. The second dielectric layer is formed on a sidewall of the opening. The variable resistance material layer is filled in the opening. A portion of the first dielectric layer is removed to expose a portion of the second dielectric layer. The first electrode is formed on the first dielectric layer and the variable resistance material layer.

In yet another embodiment of the invention, the fabricating method further includes filling a conductive layer in the opening after forming the second dielectric layer and before filling the variable resistance material layer.

In yet another embodiment of the invention, the first portion of the first electrode is a relatively-high-resistance layer, and the second portion of the first electrode is a relatively-low-resistance layer.

In yet another embodiment of the invention, a method for forming the first electrode on the first dielectric layer and the variable resistance material layer includes the following steps. A relatively-low-resistance material layer is formed on the first dielectric layer and the variable resistance material layer. A planarization process is performed to remove a portion of the relatively-low-resistance material layer to expose the second dielectric layer and the first surface of the variable resistance material layer. A relatively-high-resistance material layer is formed on the relatively-low-resistance material layer and the variable resistance material layer. The relatively-low-resistance material layer and the relatively-high-resistance material layer are patterned to form the first electrode.

In yet another embodiment of the invention, the fabricating method of the resistive memory includes the following steps. A first electrode material layer is formed. The first dielectric layer is formed on the first electrode material layer. A portion of the first dielectric layer and a portion of the first electrode material layer are removed to form the opening and the first electrode, wherein the first electrode material layer around the opening is the second portion, and the first electrode material layer under the second portion is the first portion. The second dielectric layer is formed on the sidewall of the opening. The variable resistance material layer is filled in the opening. The second electrode is formed on the first dielectric layer and the variable resistance material layer.

In yet another embodiment of the invention, the fabricating method further includes filling the conductive layer in the opening after filling the variable resistance material layer and before forming the second electrode.

In yet another embodiment of the invention, the first portion of the first electrode is the relatively-high-resistance layer, and the second portion of the first electrode is the relatively-low-resistance layer.

In yet another embodiment of the invention, a method for forming the opening and the first electrode includes the following steps. A relatively-high-resistance material layer is formed. A relatively-low-resistance material layer is formed on the relatively-high-resistance material layer. The relatively-low-resistance material layer and the relatively-high-resistance material layer are patterned. The first dielectric layer is formed on the relatively-low-resistance material layer. A portion of the first dielectric layer and a portion of the relatively-low-resistance material layer are removed.

In yet another embodiment of the invention, the fabricating method further includes removing a portion of the first dielectric layer to expose a portion of the second dielectric layer before forming the second electrode on the first dielectric layer and the variable resistance material layer, wherein the second electrode includes a third portion and a fourth portion, the third portion of the second electrode is connected with the second surface of the variable resistance material layer, the fourth portion surrounds the sidewall of the variable resistance material layer and is connected with the third portion, and the second dielectric layer is located between the fourth portion of the second electrode and the variable resistance material layer.

In yet another embodiment of the invention, the third portion of the second electrode is the relatively-high-resistance layer, and the fourth portion of the second electrode is the relatively-low-resistance layer.

In yet another embodiment of the invention, a method for forming the second electrode on the first dielectric layer and the variable resistance material layer includes the following steps. A relatively-low-resistance material layer is formed on the first dielectric layer and the variable resistance material layer. A planarization process is performed to remove a portion of the relatively-low-resistance material layer to expose the second dielectric layer and the second surface of the variable resistance material layer. A relatively-high-resistance material layer is formed on the relatively-low-resistance material layer and the variable resistance material layer. The relatively-low-resistance material layer and the relatively-high-resistance material layer are patterned to form the second electrode.

Based on the above, in the resistive memory of the invention, the portion of the electrode located above the variable resistance material layer has less thickness in comparison with other portions of the electrode. Thus, the portion of the electrode located above the variable resistance material layer has higher resistance. Consequently, when an operation current flows through the electrode, better heat generation efficiency is achieved above the variable resistance material layer, and further, the resistance state of the variable resistance material layer can be effectively changed to prevent waste of energy and improve the operation efficiency of the device.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIGS. 8A and 8B illustrate performing an operation on the resistive memory of the first embodiment of the invention, wherein FIG. 8B is a cross-sectional view of FIG. 8A along the C-C line.

FIGS. 9A and 9B illustrate performing another operation on the resistive memory of the first embodiment of the invention, wherein FIG. 9B is a cross-sectional view of FIG. 9A along the C-C line.

DESCRIPTION OF THE EMBODIMENTS

Exemplary embodiments of the invention are explained below with reference to the accompanying drawings to better illustrate the disclosure. The invention, however, may be carried out in various forms and should not be construed as limited to the embodiments set forth herein.

Figure 1:
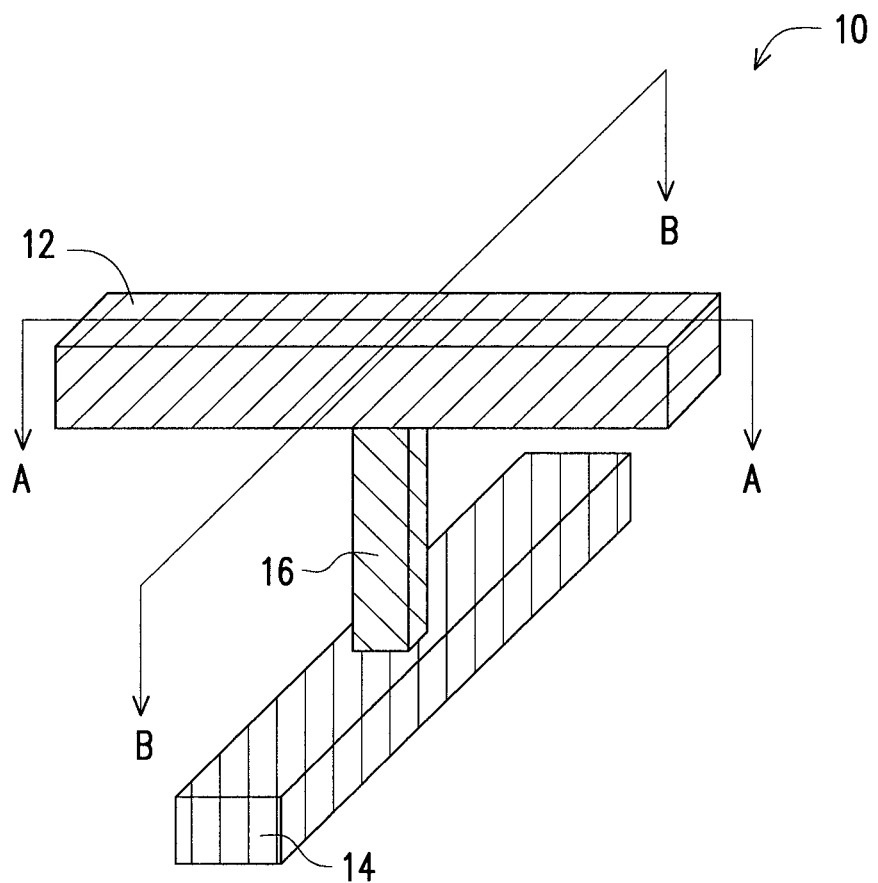
FIG. 1 is a schematic perspective view illustrating a structure of a resistive memory.

FIG. 1 is a schematic perspective view illustrating a structure of a resistive memory. Referring to FIG. 1, a resistive memory 10 includes a strip-shaped electrode 12, a strip-shaped electrode 14, a conductive layer 16, and a variable resistance material layer (not shown). In this embodiment, an extending direction of the electrode 12 and an extending direction of the electrode 14 intersect each other. The electrode 12 may be deemed as a top electrode and the electrode 14 may be deemed as a bottom electrode, and the conductive layer 16 is used to connect the variable resistance material layer and the electrode 12 or 14.

A structure of the resistive memory of the invention is as illustrated in FIG. 1, wherein an A cross-section is along the A-A line in FIG. 1, and a B cross-section is along the B-B line in FIG. 1. In the following paragraphs, the A and/or B cross-sections are used to illustrate a method for fabricating the resistive memory of the invention.

FIGS. 2A to 2D illustrate a process flow for fabricating a resistive memory according to the first embodiment of the invention, which are cross-sectional views along the A cross-section.

Figure 2A:
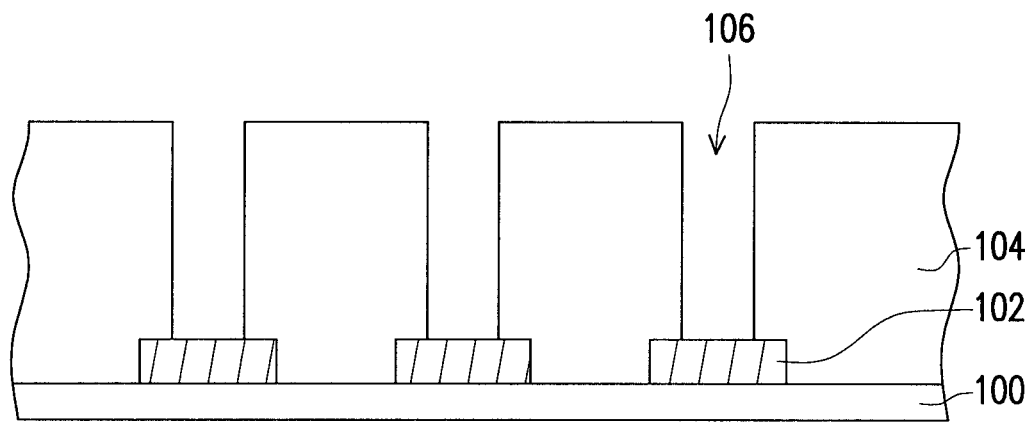
FIGS. 2A to 2D illustrate a process flow for fabricating a resistive memory according to the first embodiment of the invention.

First, referring to FIG. 2A, a strip-shaped electrode 102 is formed on a dielectric substrate 100. The dielectric substrate 100 is, for example, a dielectric layer formed on a silicon substrate. A material of the electrode 102 is, for example, titanium nitride, tantalum nitride, tungsten, copper, aluminum, an aluminum-copper alloy, or an aluminum-silicon-copper alloy. A method for forming the electrode 102, for example, includes first forming a conductive material layer on the dielectric substrate 100 and then patterning the conductive material layer. Next, a dielectric layer 104 is formed on the electrode 102. A material of the dielectric layer 104 is silicon oxide, for example. A method for forming the dielectric layer 104 for example includes performing a chemical vapor deposition process. Thereafter, an opening 106 is formed in the dielectric layer 104 to expose a portion of the electrode 102. A method for forming the opening 106 includes, for example, performing an anisotropic etching process. In this embodiment, the electrode 102 is a second electrode and is used as the bottom electrode of the resistive memory.

Figure 2B:
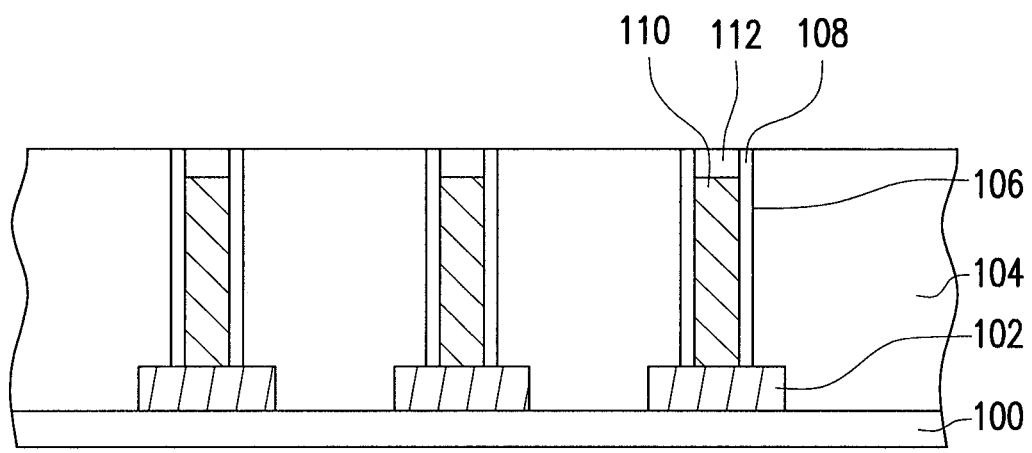

Next, referring to FIG. 2B, a sidewall dielectric layer 108 is formed on a sidewall of the opening 106. A material of the dielectric layer 108 is, for example, silicon nitride. A method for forming the sidewall dielectric layer 108 includes, for example, first conformally forming a dielectric material layer on the dielectric substrate 100 and then performing an anisotropic etching process on the dielectric material layer to remove the dielectric material layer on the dielectric layer 104 and the portion of the electrode 102 exposed by the opening 106. The sidewall dielectric layer 108 is thus formed. Following that, a conductive material is filled into a portion of the opening 106 to form a conductive layer 110. The conductive material is, for example, titanium nitride, tantalum nitride, tungsten, copper, aluminum, an aluminum-copper alloy, or an aluminum-silicon-copper alloy. Then, a variable resistance material is filled into the opening 106 to form a variable resistance material layer 112 (a memory device). The variable resistance material is, for example, a chalcogenide or a transition metal oxide. The chalcogenide is a GeSbTe alloy, a AgInSbTe alloy, an AlAsTe alloy, or the like, for example. The transition metal oxide is $WO_x$, $HfO_x$, $TaO_x$, $TiO_x$, $CuO_x$, $NiO_x$, $ZnO_x$, or the like, for example. In this embodiment, in the case that the material of the conductive layer 110 is the same as the material of the electrode 102, the conductive layer 110 may be deemed as a protruding portion of the electrode 102. Nevertheless, the invention should not be construed as limited to the above disclosure. In other embodiments, the electrode 102 may not have the conductive layer 110 according to the actual requirements. In that case, the variable resistance material layer 112 is disposed in the entire opening 106 and connected with the portion of the electrode 102 exposed by the opening 106.

In this embodiment, an etching rate of the sidewall dielectric layer 108 is less than an etching rate of the dielectric layer 104, so as to be used as a protection layer of the variable resistance material layer 112 and the conductive layer 110 in the subsequent etching processes (described in the following paragraphs) to prevent short circuit caused by the exposure of the variable resistance material layer 112 and the conductive layer 110. In other embodiments, the sidewall dielectric layer 108 does not need to be formed in the opening 106 if the short circuit is avoidable.

Figure 2C:
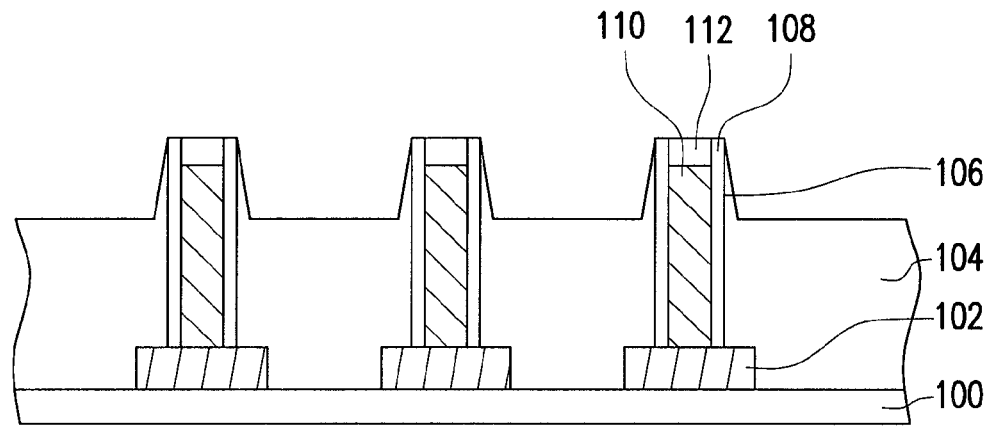

Referring to FIG. 2C, a portion of the dielectric layer 104 is removed to expose a portion of the sidewall dielectric layer 108. A method for removing the portion of the dielectric layer 104 includes performing an anisotropic etching process, for example.

Figure 2D:
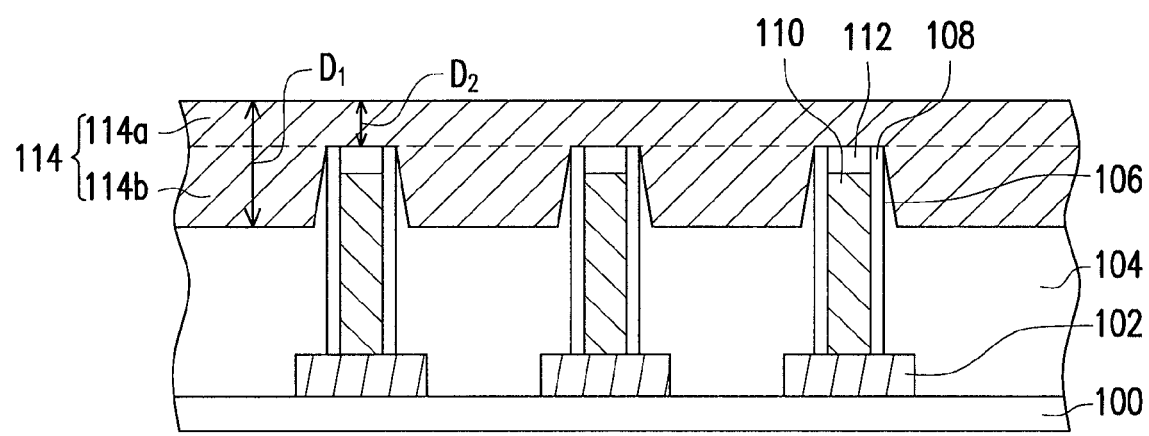

Referring to FIG. 2D, a strip-shaped electrode 114 is formed on the dielectric layer 104 and the variable resistance material layer 112 to complete the fabrication of the resistive memory of this embodiment. A material of the electrode 114 is, for example, titanium nitride, tantalum nitride, tungsten, copper, aluminum, an aluminum-copper alloy, or an aluminum-silicon-copper alloy. A method for forming the electrode 114, for example, includes first forming a conductive material layer and then patterning the conductive material layer. The electrode 114 includes a first portion 114a and a second portion 114b, wherein the second portion 114b surrounds the variable resistance material layer 112 and is separated from the variable resistance material layer 112 by the sidewall dielectric layer 108. The first portion 114a is located on the second portion 114b and the variable resistance material layer 112, and the first portion 114a is connected with the variable resistance material layer 112. In this embodiment, the electrode 114 is a first electrode and is used as the top electrode of the resistive memory.

In addition, a thickness $D_1$ of the electrode 114 on the dielectric layer 104 (including the first portion 114a and the second portion 114b) is greater than a thickness $D_2$ of the electrode 114 on the variable resistance material layer 112 (including the first portion 114a). Therefore, when the resistive memory of this embodiment is operated, a cross-sectional area perpendicular to the current direction of the electrode 114 on the dielectric layer 104 is greater than a cross-sectional area perpendicular to the current direction of the electrode 114 on the variable resistance material layer 112, such that the electrode 114 on the variable resistance material layer 112 has higher current density. Accordingly, when the resistive memory of the invention is operated and when an operation current flows through the electrode 114 on the variable resistance material layer 112, the electrode 114 on the variable resistance material layer 112 provides better heat generation efficiency, which effectively changes a resistance state of the variable resistance material layer 112 and improves the operation efficiency of the resistive memory.

It is noted that, in this embodiment, the first portion 114a and the second portion 114b of the electrode 114 are formed of the same material, that is, the electrode 114 is a single-layer structure. Nevertheless, the invention should not be construed as limited to the above disclosure.

Figure 3:
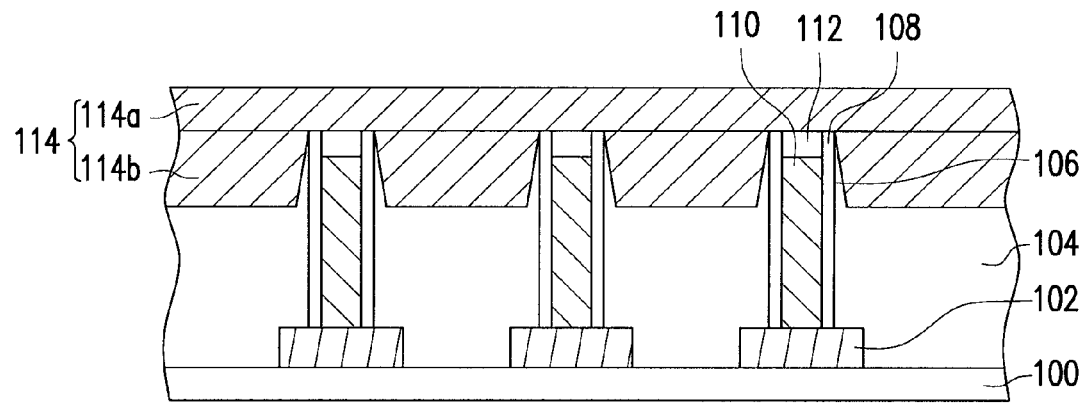
FIG. 3 is a schematic cross-sectional view of a resistive memory according to the second embodiment of the invention.

FIG. 3 is a schematic cross-sectional view of a resistive memory according to the second embodiment of the invention, which is a cross-sectional view along the A cross-section. In this embodiment, elements the same as those of FIG. 2D are denoted by identical reference numerals. Referring to FIG. 3, the first portion 114a and the second portion 114b of the electrode 114 are formed of different materials. That is to say, the electrode 114 has a double-layer structure, wherein a resistance of a material of the first portion 114a is higher than a resistance of a material of the second portion 114b. In other words, the first portion 114a is a relatively-high-resistance layer, and the second portion 114b is a relatively-low-resistance layer. A material of the relatively-high-resistance layer is titanium nitride, tantalum nitride, or polysilicon, for example; and a material of the relatively-low-resistance layer is tungsten, copper, aluminum, an aluminum-copper alloy, or an aluminum-silicon-copper alloy, for example. In this embodiment, a method for forming the electrode 114 includes the following steps: first, forming a relatively-low-resistance material layer on the dielectric layer 104 to cover the variable resistance material layer 112. Then, a planarization process is performed to remove a portion of the relatively-low-resistance material layer to expose the variable resistance material layer 112. Next, a relatively-high-resistance material layer is formed on the relatively-low-resistance material layer and the variable resistance material layer 112. Thereafter, the relatively-low-resistance material layer and the relatively-high-resistance material layer are patterned to form the electrode 114 with the double-layer structure.

In the case of operating the resistive memory having the double-layer structure, when the operation current flows into the electrode 114 before passing the variable resistance material layer 112, the operation current mainly flows into the relatively-low-resistance layer (the second portion 114b). Since the relatively-low-resistance layer has lower resistance, not much heat energy is generated. When the operation current is to flow into the variable resistance material layer 112, because the relatively-high-resistance layer (the first portion 114a) is above the variable resistance material layer 112 and has a smaller cross-sectional area for the current to flow through, the relatively-high-resistance layer above the variable resistance material layer 112 has better heat generation efficiency, which effectively changes the resistance state of the variable resistance material layer 112.

Figure 4A:
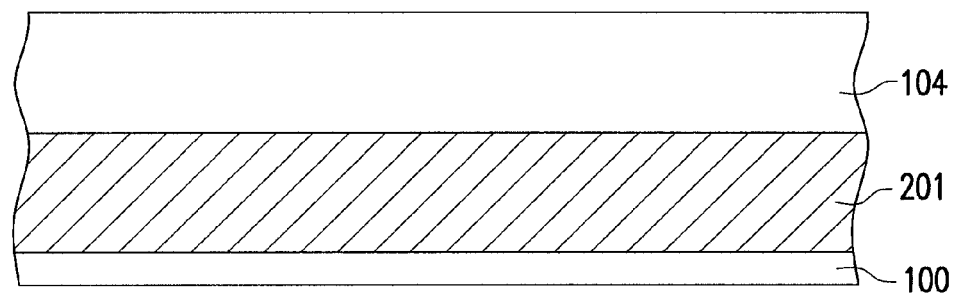
FIGS. 4A to 4C illustrate a process flow for fabricating a resistive memory according to the third embodiment of the invention.
Figure 4B:
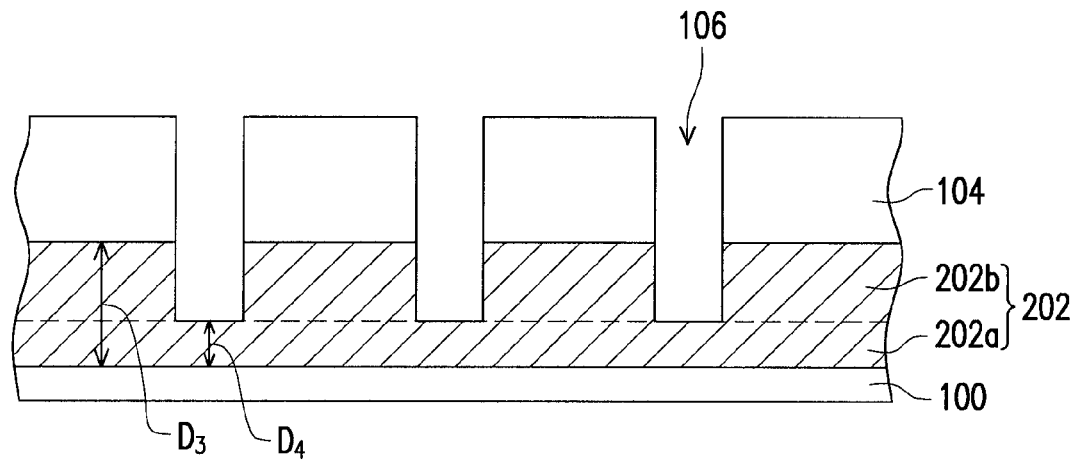
Figure 4C:
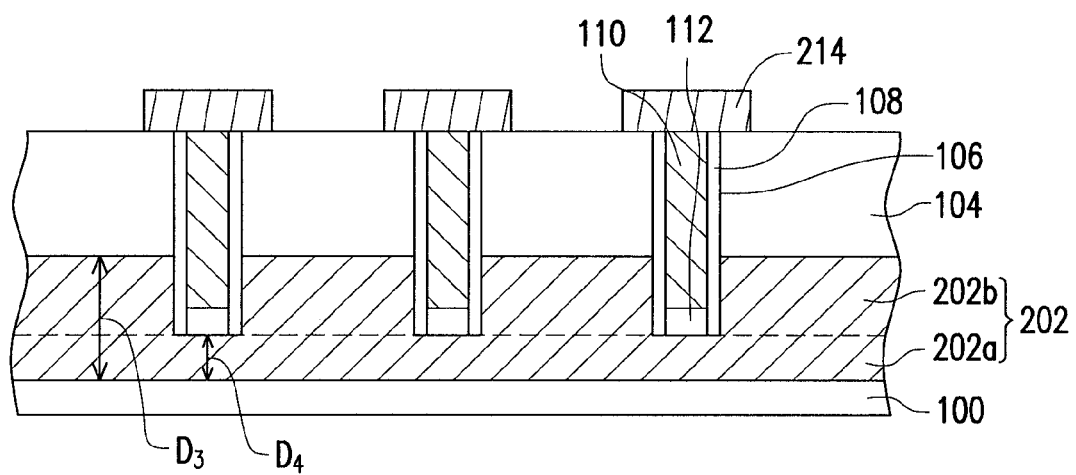

FIGS. 4A to 4C illustrate a process flow for fabricating a resistive memory according to the third embodiment of the invention, which are cross-sectional views along the B cross-section. In addition, elements that are the same in the third embodiment and the first embodiment are denoted by identical reference numerals, and descriptions thereof are not repeated hereinafter.

First, referring to FIG. 4A, a strip-shaped electrode 201 is formed on the dielectric substrate 100. A material of the electrode 201 is, for example, titanium nitride, tantalum nitride, tungsten, copper, aluminum, an aluminum-copper alloy, or an aluminum-silicon-copper alloy. A method for forming the electrode 201, for example, includes first forming a conductive material layer on the dielectric substrate 100 and then patterning the conductive material layer. Next, the dielectric layer 104 is formed on the electrode 201.

Then, referring to FIG. 4B, a portion of the dielectric layer 104 is removed to expose a portion of the electrode 201. Thereafter, a portion of the exposed electrode 201 is removed to form an electrode 202 and the opening 106. The electrode 202 includes a first portion 202a and a second portion 202b, wherein the second portion 202b is located around the opening 106, and the first portion 202a is located under the second portion 202b. The opening 106 exposes a portion of the first portion 202a. In this embodiment, the first portion 202a and the second portion 202b of the electrode 202 are formed of the same material, which means that the electrode 202 is a single-layer structure. In this embodiment, the electrode 202 is a first electrode and is used as the bottom electrode of the resistive memory.

Moreover, a thickness $D_4$ of the electrode 202 under the opening 106 (the first portion 202a) is less than a thickness $D_3$ of the electrode 202 in the other areas (including the first portion 202a and the second portion 202b). Therefore, when the resistive memory of this embodiment is operated, a cross-sectional area perpendicular to the current direction of the electrode 202 under the opening 106 is less than a cross-sectional area perpendicular to the current direction of the electrode 202 in the other areas. Thus, the current density of the electrode 202 under the opening 106 is higher than the current density of the electrode 202 in the other areas.

Then, referring to FIG. 4C, a process similar to FIG. 2B is performed to form the sidewall dielectric layer 108 on the sidewall of the opening 106. Thereafter, a variable resistance material is filled into a portion of the opening 106 to form the variable resistance material layer 112. In this embodiment, the variable resistance material layer 112 is in contact with the electrode 202 located under the opening 106. Following that, a conductive material is filled into the opening 106 to form the conductive layer 110. Then, a strip-shaped electrode 214 is formed on the dielectric layer 104 and the variable resistance material layer 112 to complete the fabrication of the resistive memory of this embodiment. A material of the electrode 214 is, for example, titanium nitride, tantalum nitride, tungsten, copper, aluminum, an aluminum-copper alloy, or an aluminum-silicon-copper alloy. A method for forming the electrode 214, for example, includes first forming a conductive material layer on the dielectric substrate 100 and then patterning the conductive material layer. In this embodiment, the electrode 214 is a second electrode and is used as the top electrode of the resistive memory.

In this embodiment, in the case that the material of the conductive layer 110 is the same as the material of the electrode 214, the conductive layer 110 may be deemed as a protruding portion of the electrode 214. Nevertheless, the invention should not be construed as limited to the above disclosure. In other embodiments, the electrode 214 may not have the conductive layer 110 according to the actual requirements. In that case, the variable resistance material layer 112 is formed in the entire opening 106.

According to the disclosure of the first embodiment, it should be understood that, when the operation current flows through the electrode 202 which contacts the variable resistance material layer 112, better heat generation efficiency is achieved in comparison with other areas. Thus, the resistance state of the variable resistance material layer 112 is effectively changed to improve the operation efficiency of the resistive memory.

In this embodiment, the electrode 202 is a single-layer structure; however, the invention is not limited thereto.

Figure 5:
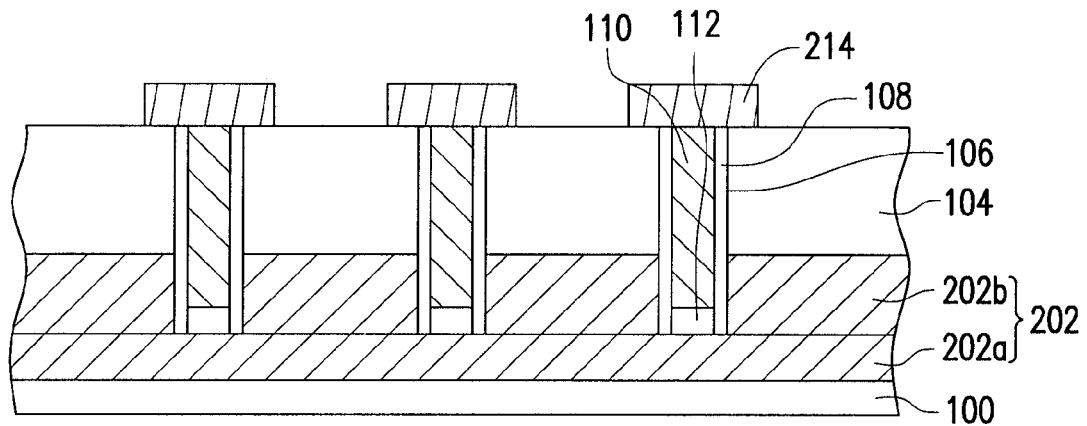
FIG. 5 is a schematic cross-sectional view of a resistive memory according to the fourth embodiment of the invention.

FIG. 5 is a schematic cross-sectional view of a resistive memory according to the fourth embodiment of the invention, which is a cross-sectional view along the B cross-section. In this embodiment, elements the same as those of FIG. 4C are denoted by identical reference numerals. Referring to FIG. 5, the first portion 202a and the second portion 202b of the electrode 202 are formed of different materials. That is to say, the electrode 202 has a double-layer structure, wherein the resistance of the material of the first portion 202a is higher than the resistance of the material of the second portion 202b. In other words, the first portion 202a is a relatively-high-resistance layer, and the second portion 202b is a relatively-low-resistance layer. A material of the relatively-high-resistance layer is titanium nitride, tantalum nitride, or polysilicon, for example; and a material of the relatively-low-resistance layer is tungsten, copper, aluminum, an aluminum-copper alloy, or an aluminum-silicon-copper alloy, for example. In this embodiment, a method for forming the electrode 202 includes the following steps: first, forming a relatively-high-resistance material layer on the dielectric substrate 100. Next, a relatively-low-resistance material layer is formed on the relatively-high-resistance material layer. Then, the relatively-low-resistance material layer and the relatively-high-resistance material layer are patterned. Following that, a portion of the relatively-low-resistance material layer is removed during the process of forming the opening 106.

In the case of operating the resistive memory having the double-layer structure, when the operation current flows into the electrode 202 before passing the variable resistance material layer 112, the operation current mainly flows into the relatively-low-resistance layer (the second portion 202b). Since the relatively-low-resistance layer has lower resistance, not much heat energy is generated. When the operation current is to flow into the variable resistance material layer 112, because the relatively-high-resistance layer (the first portion 202a) is under the variable resistance material layer 112 and has a smaller cross-sectional area for the current to flow through, the relatively-high-resistance layer under the variable resistance material layer 112 has better heat generation efficiency, which effectively changes the resistance state of the variable resistance material layer 112.

Figure 6:
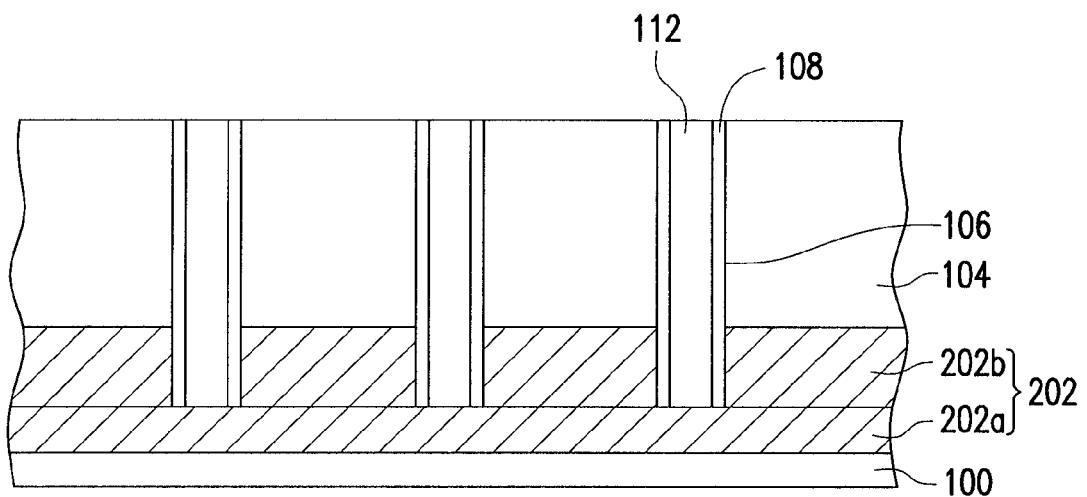
FIGS. 6, 7A to 7B illustrate a process flow for fabricating a resistive memory according to the fifth embodiment of the invention.
Figure 7A:
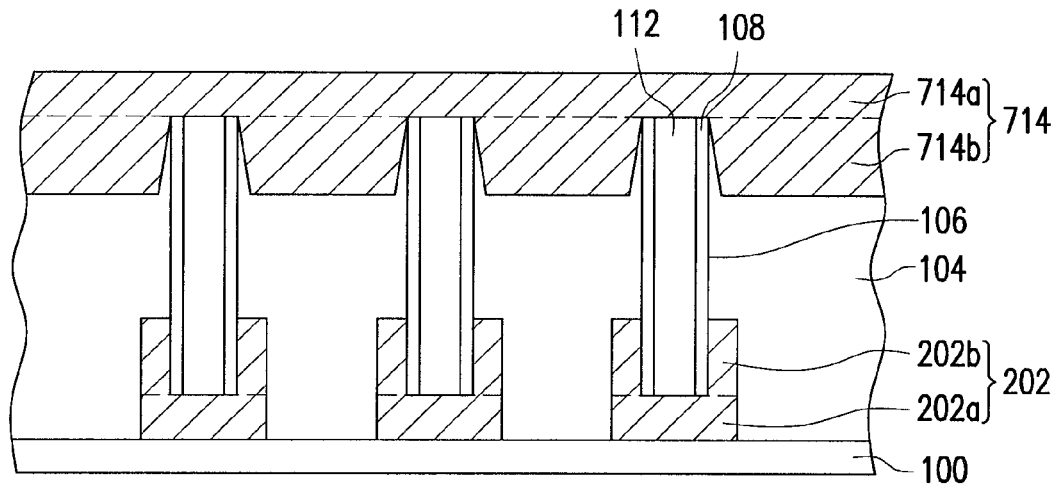
Figure 7B:
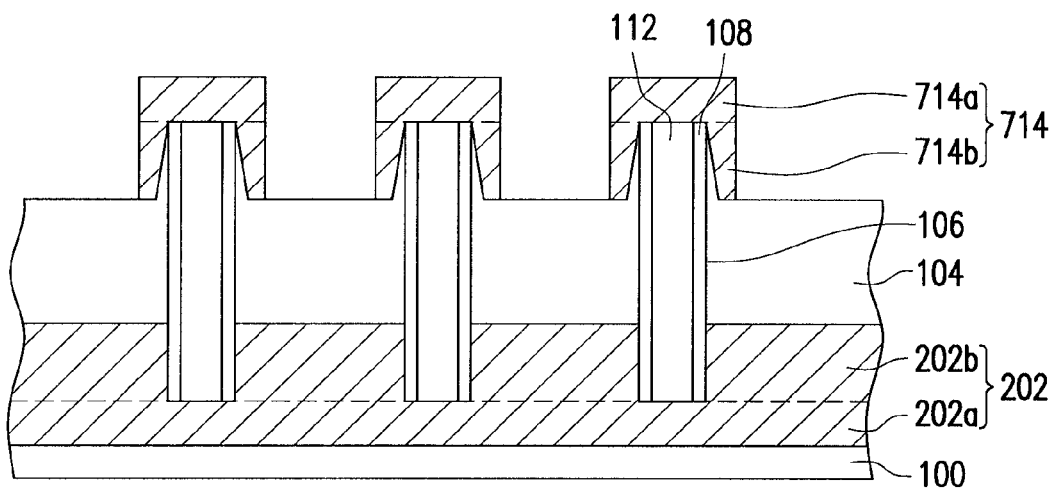

FIGS. 6 to 7B illustrate a process flow for fabricating a resistive memory according to the fifth embodiment of the invention, wherein FIG. 7A is a cross-sectional view along the A cross-section, and FIGS. 6 and 7B are cross-sectional views along the B cross-section. In FIGS. 6 to 7B, elements the same as those in the above embodiments are denoted by identical reference numerals, and descriptions thereof are not repeated hereinafter.

First, referring to FIG. 6, after performing the step illustrated in FIG. 4B, a process similar to FIG. 2B is performed to form the side dielectric layer 108 on the sidewall of the opening 106. Then, a variable resistance material is filled into the opening 106 to form the variable resistance material layer 112. In this embodiment, because the variable resistance material layer 112 needs to be in contact with the electrode 202 thereunder and the electrode above (to be formed in the subsequent steps), the variable resistance material layer 112 needs to be formed in the entire opening 106. In this embodiment, the electrode 202 is a first electrode and is used as the bottom electrode of the resistive memory.

Next, referring to both FIGS. 7A and 7B, a process similar to FIGS. 2C to 2D is performed to remove a portion of the dielectric layer 104, so as to expose a portion of the sidewall dielectric layer 108. Thereafter, the strip-shaped electrode 714 is formed on the dielectric layer 104 and the variable resistance material layer 112 to complete the fabrication of the resistive memory of this embodiment. Moreover, the electrode 714 includes the third portion 714a and the fourth portion 714b, and the electrode 714 can have a single-layer or double-layer structure. In this embodiment, the electrode 714 is a second electrode and is used as the top electrode of the resistive memory.

Furthermore, although FIGS. 7A and 7B illustrate that the electrodes 714 and 202 both have the single-layer structure, based on the above embodiments, persons skilled in the art should understand that the structure of each of the electrodes 714 and 202 is adjustable according to the actual requirement and application.

It is noted that, in the resistive memory of the invention, a width of the electrode may be adjusted to further improve the operation efficiency. The resistive memory of the first embodiment is explained below as an example.

Figure 8A:
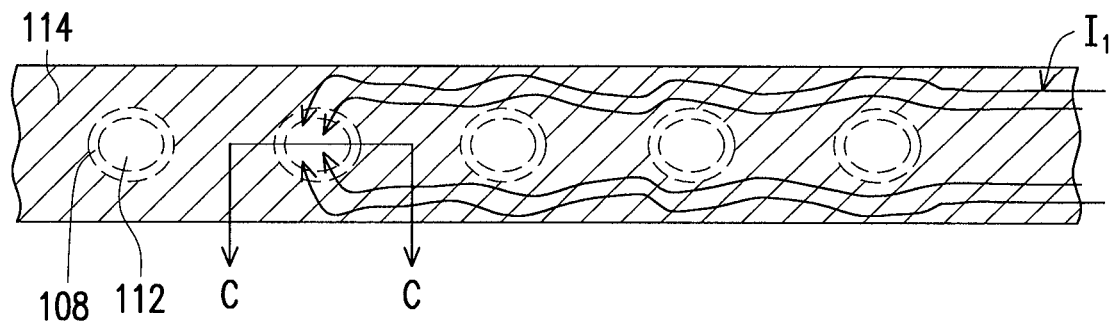
Figure 8B:
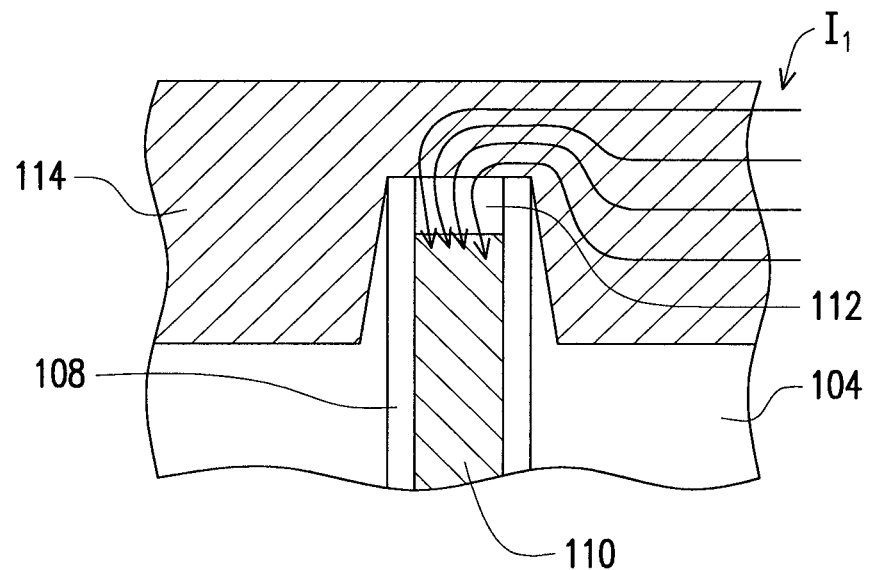

FIGS. 8A and 8B illustrate performing an operation on the resistive memory of the first embodiment of the invention, wherein FIG. 8B is a cross-sectional view along the C-C line of FIG. 8A. Referring to FIGS. 8A and 8B, the electrode 114 is designed to have a sufficient width, such that when an operation current $I_1$ flows into the electrode 114 and before reaching the variable resistance material layer 112 of the memory cell that is to be operated, the operation current $I_1$ mainly flows through a low resistance portion (i.e. the portion of the electrode 114 which has larger thickness) around the variable resistance material layer 112 of other memory cells and does not flow through a high resistance portion (i.e. the portion of the electrode 114 which has less thickness) on the variable resistance material layer 112 of the memory cells. Therefore, the operation current $I_1$ flows to the high resistance portion (i.e. the portion of the electrode 114 which has less thickness) on the variable resistance material layer 112 of the memory cell that is to be controlled and passes through the variable resistance material layer 112 only when the operation current $I_1$ reaches the memory cell that is to be operated.

Figure 9A:
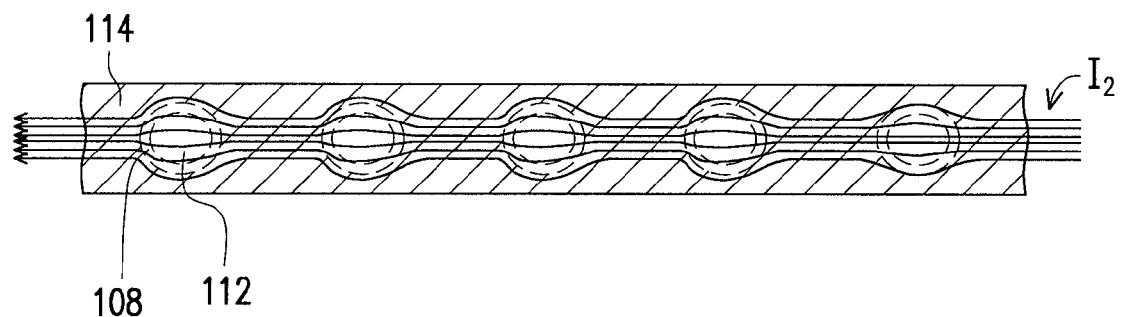
Figure 9B:
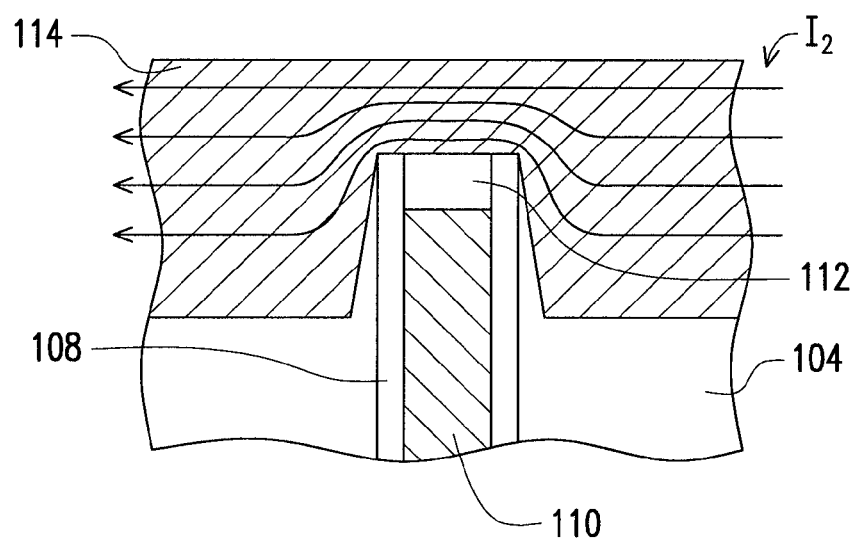

FIGS. 9A and 9B illustrate performing another operation on the resistive memory of the first embodiment of the invention, wherein FIG. 9B is a cross-sectional view along the D-D line of FIG. 9A. Referring to FIGS. 9A and 9B, the width of the electrode 114 is designed to be sufficiently narrow, so as to force the operation current $I_2$ to pass through the high resistance portion (i.e. the portion of the electrode 114 which has less thickness) on each variable resistance material layer 112 when flowing through each memory cell.

To conclude the above, in the resistive memory disclosed in each embodiment of the invention, the portion of the electrode located above the variable resistance material layer has less thickness and thus has higher resistance. Consequently, when the operation current flows through the electrode above the variable resistance material layer, better heat generation efficiency is achieved, and further, the resistance state of the variable resistance material layer can be effectively changed to improve the operation efficiency.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A resistive memory, comprising:
    a first electrode having a first portion and a second portion;
    a second electrode disposed opposite to the first electrode;
    a variable resistance material layer having a sidewall, a first surface, and a second surface opposite to the first surface, wherein the first surface of the variable resistance material layer is connected with the first portion of the first electrode, the second surface of the variable resistance material layer is electrically connected with the second electrode, and the second portion surrounds the sidewall of the variable resistance material layer and is connected with the first portion;
    a first dielectric layer disposed between the first electrode and the second electrode; and
    a second dielectric layer disposed between the variable resistance material layer and the second portion of the first electrode.

2. The resistive memory according to claim 1, wherein a material of the first portion is different from a material of the second portion, and a resistance of the material of the first portion is higher than a resistance of the material of the second portion.

3. The resistive memory according to claim 2, wherein the material of the first portion comprises titanium nitride, tantalum nitride, or polysilicon; and the material of the second portion comprises tungsten, copper, aluminum, an aluminum-copper alloy, or an aluminum-silicon-copper alloy.

4. The resistive memory according to claim 1, wherein a material of the first portion is the same as a material of the second portion, and the material of the first electrode comprises titanium nitride, tantalum nitride, tungsten, copper, aluminum, an aluminum-copper alloy, or an aluminum-silicon-copper alloy.

5. The resistive memory according to claim 1, further comprising a conductive layer, wherein the conductive layer is connected with the variable resistance material layer and the second electrode.

6. The resistive memory according to claim 1, wherein a material of the variable resistance material layer comprises a chalcogenide or a transition metal oxide.

7. The resistive memory according to claim 1, wherein the second electrode has a third portion and a fourth portion, the second surface of the variable resistance material layer is connected with the third portion of the second electrode, and the fourth portion surrounds the sidewall of the variable resistance material layer and is connected with the third portion.

8. The resistive memory according to claim 7, wherein the second dielectric layer is disposed between the variable resistance material layer and the second portion of the first electrode and disposed between the variable resistance material layer and the fourth portion of the second electrode.

9. The resistive memory according to claim 7, wherein a material of the third portion is different from a material of the fourth portion, and a resistance of the material of the third portion is higher than a resistance of the material of the fourth portion.

10. The resistive memory according to claim 9, wherein the material of the third portion comprises titanium nitride, tantalum nitride, or polysilicon; and the material of the fourth portion comprises tungsten, copper, aluminum, an aluminum-copper alloy, or an aluminum-silicon-copper alloy.

11. The resistive memory according to claim 7, wherein a material of the third portion is the same as a material of the fourth portion, and the material of the second electrode comprises titanium nitride, tantalum nitride, tungsten, copper, aluminum, an aluminum-copper alloy, or an aluminum-silicon-copper alloy.

12. The resistive memory according to claim 1, wherein the first electrode has a first thickness and a second thickness, wherein the first thickness is greater than the second thickness.

13. A resistive memory, comprising:
    a first electrode, having a first thickness and a second thickness, wherein the first thickness is greater than the second thickness;
    a second electrode, disposed opposite to the first electrode, wherein the second electrode has a third thickness and a fourth thickness, and the third thickness is greater than the fourth thickness;
    a memory device, having a first surface and a second surface and located between the first electrode having the second thickness and the second electrode, wherein the memory device is located between the first electrode having the second thickness and the second electrode having the fourth thickness; and a dielectric layer, surrounding the memory device, wherein the dielectric layer is coplanar with the first surface of the memory device, and the dielectric layer and the first surface of the memory device are in contact with the first electrode having the second thickness, wherein the dielectric layer is coplanar with the second surface of the memory device, and the dielectric layer and the second surface of the memory device are in contact with the second electrode having the fourth thickness.

14. The resistive memory according to claim 13, wherein a material of the second electrode comprises titanium nitride, tantalum nitride, tungsten, copper, aluminum, an aluminum-copper alloy, or an aluminum-silicon-copper alloy.

* * * * *